April 5, 1955 M. G. CROSBY 2,705,775

MODULATED WAVE AMPLIFIER

Filed March 27, 1952

INVENTOR.
Murray G. Crosby
BY Lippincott & Smith.
ATTORNEYS

United States Patent Office 2,705,775

Patented Apr. 5, 1955

2,705,775

MODULATED WAVE AMPLIFIER

Murray G. Crosby, Mineola, N. Y.

Application March 27, 1952, Serial No. 278,976

8 Claims. (Cl. 332—41)

The present invention relates to modulated wave amplifiers. In its more specific form it is directed to amplifiers of modulated waves wherein there is a component of amplitude modulation to be maintained without distortion as a result of the amplification process.

Amplifiers of this general type are used in the practice of single-sideband transmission, found to be particularly useful for various forms of point-to-point communication services, as well as for the transmission of television signals, although for television signals some portions of each sideband in the general region of the video carrier normally remain.

The prior art, as it exists, has gone to great lengths to use Class B linear amplifiers, adjusted with a great degree of care to reduce the non-linear amplitude distortion to a low degree in the process of amplifying modulated waves having an amplitude modulation component therewith. It has been found, however, that in order to obtain a desired high degree of linearity following such practice, it is necessary to sacrifice the power amplifying capabilities to the extent that the systems of this type are inefficient in their utilization of the available capabilities of the power amplifier tube selected. It is this general nature of difficulty which is intended to be overcome by the invention herein to be disclosed.

It has been recognized in these operations that Class C amplification would be highly desirable. This is because it uses the capability of the amplifier tube to the maximum extent. However, amplification of this type usually involves saturation of the amplitude characteristic, with a resultant removal of the amplitude modulation in a manner which follows closely that of a limiter.

The present invention has as one of its principal purposes that of disclosing a system in which the more efficient forms of amplification, following the practices of Class C amplifiers and similar types, may be used in such a way as to remove the amplitude component prior to the amplification process, but to reinsert and reintroduce this removed amplitude component as a step in a remodulation process. As the invention will herein be disclosed and set forth, it will be found to relate to all forms of modulated waves having amplitude modulation components which must be preserved. Accordingly, this broad feature will be understood to include the single-sideband type of wave, in which one sideband has been removed. It includes also other forms of modulation, such as quadrature carrier amplitude modulation, which is equivalent to amplitude modulation with the carrier component shifted 90° in phase. Thus, for these forms of modulation which have heretofore inefficiently used the therewith-associated amplifier systems, there is an opening up of new fields of utilization.

The system to be disclosed by this invention is one which depends upon the fact that the modulated wave, such as the single-sideband wave, has two components of modulation. One of these is the amplitude modulation component. The other component is the phase modulation component. If, in amplifying the amplitude modulation component, a non-linear distortion is introduced, the amplitude envelope will be affected, but the phase modulation component will be unaffected. Consequently, if the amplitude envelope is introduced properly after amplification, any effects of non-linearity can be removed.

Under the system proposed by the present invention, a modulated input is supplied, for instance, to a single-sideband exciter. The modulated wave output is fed from this exciter to a suitable amplifier, either directly or through a limiter, where it is amplified with the higher efficiency types of amplification. These types of amplification tend to remove the amplitude modulation component during the process of amplification. However, after amplification, the amplified wave is supplied to an amplitude modulator and thence to a load circuit. The amplitude-modulated wave as it is supplied to the load circuit is then, in turn, differentially detected along with the wave supplied to the input of the amplifier. The amplitude envelope is restored by an amplitude modulation process which is controlled from the detection of the amplitude envelope on the original modulated wave which is compared with the detected outgoing wave.

In the practice of the invention according to one of its preferred forms, the modulation input which is to be used to modulate a suitable carrier is introduced into a low level single-sideband exciter along with the carrier. The output from the exciter preferably passes through a suitable limiter and the output of the limiter supplies an amplifier which introduces distortion. This amplifier output is supplied to a suitable amplitude modulator which feeds its output to the load circuit.

The distortion introduced into this signal may be of such a character that even if the limiter is not present the amplitude envelope of the single-sideband exciter voltage is substantially removed. To reintroduce this envelope, the invention proposes the use of a pair of detectors whose outputs are differentially combined and utilized to control the amplitude modulator. One of these detectors receives as its input the input voltage supplied to the limiter or amplifier. The other of the detectors receives at its input a part of the output supplied to the load circuit, so that the difference between the detected input wave and the detected output wave may develop a signal utilized for control of the amplitude modulator.

The invention is capable of being practiced according to various forms of circuit instrumentalities, of which a preferred form is exemplified by the accompanying drawings, wherein.

Figures 1, 2:
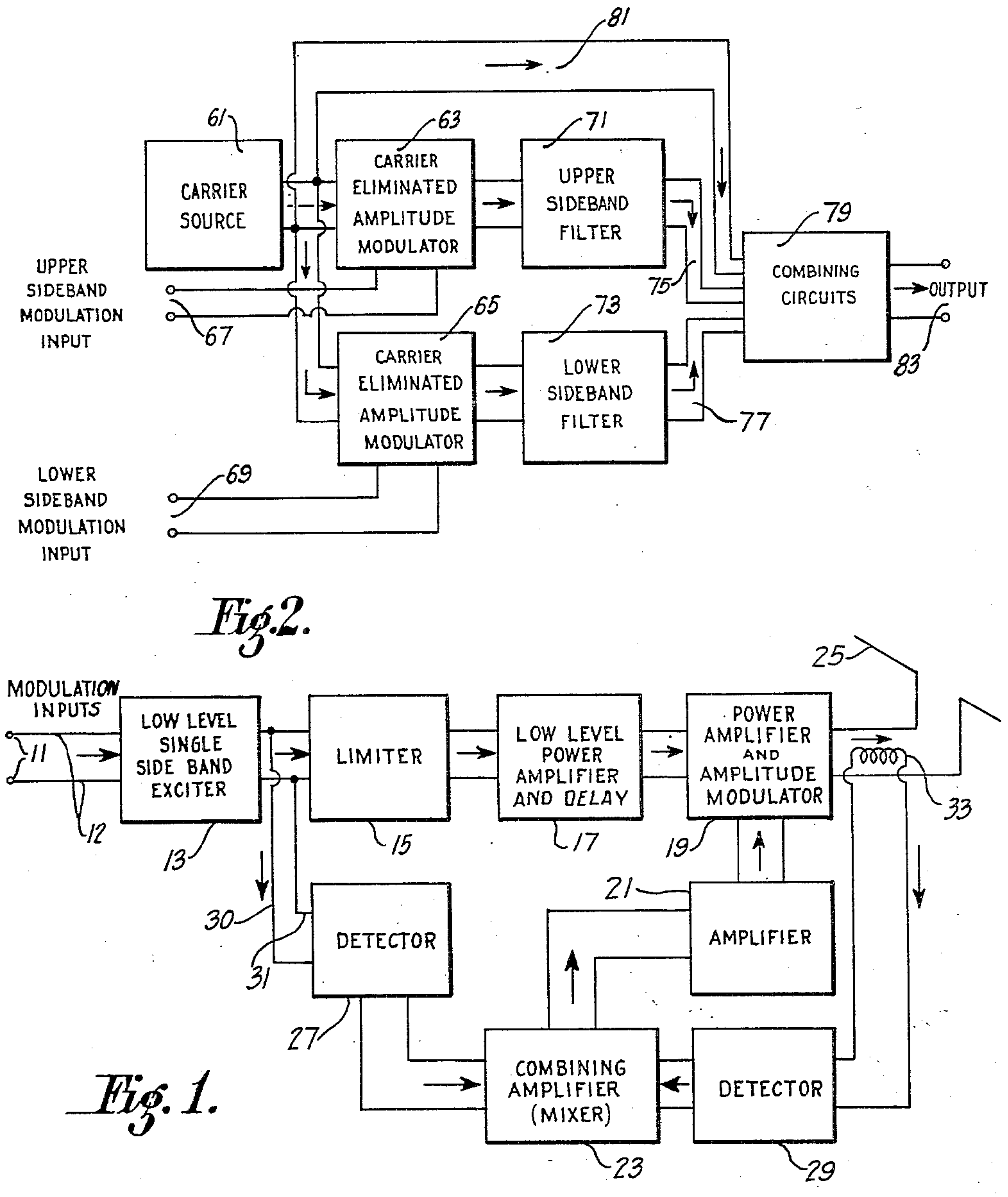
Fig. 1 represents in diagrammatic fashion the preferred embodiment of the system.
Fig. 2 represents in schematic form a single-sideband exciter for use in the circuit of Fig. 1.

If reference is now made to the foregoing drawings and it is borne in mind that, for the purpose of describing the invention, a single-sideband signal output will be used as an example, the advantages of the system according to this invention will be more directly appreciated. It may be seen from a consideration of the drawings that any type of input wave having components of amplitude and phase modulation may be utilized. The single-sideband wave is represented by the equation $$e=E_c \sin W_c t+E_s \sin W_s t \qquad (1)$$

in which $E_c$ represents the amplitude of the carrier component, $E_s$ represents the amplitude of the sideband component, $W_c$ represents the angular velocity of the carrier wave, and $W_s$ represents the angular velocity of the sideband wave, and $e$ is the instantaneous voltage.

By means of vector addition, the carrier and sideband components represented by the two sine waves on the right-hand side of Equation 1, supra, produce an overall resultant wave. This resultant wave will have an amplitude variation and a phase variation which is produced by the addition of the two waves having different frequencies. Vector addition of the two waves produces a wave which is represented by the equation $$e=\overbrace{\sqrt{E_c^2+E_s^2+2E_cE_s \cos (W_s-W_c)t}}^{(A)}\ \overbrace{\sin \left(\omega t+\tan^{-1} \frac{E_s \sin (W_s-W_c)t}{E_c+E_s \cos (W_s-W_c)t}\right)}^{(B)} \qquad (2)$$

In the foregoing equation representing the resultant vector addition, the amplitude envelope is that part which is indicated beneath the bracket (A). The phase modulation component is that part of the wave indicated as beneath the bracket (B). This phase modulation component represents angular modulation which is immune to any non-linear amplitude effects. The amplitude envelope represented by the portion (A) of the equation, on the other hand, is sensitive to amplitude effects. Consequently, it is only when the amplifying system operates linearly that it is possible to provide a true reproduction of this amplitude envelope when the total wave is amplified.

A requirement of this nature becomes particularly rigid in a single-sideband type of amplifier system. This is largely because the degree of linearity which it requires is one which results in a power amplifier of extremely low efficiency.

It is for reasons such as these that it has been customary in practice to use Class B linear amplifiers which have been carefully adjusted to produce a very low degree of non-linearity. However, the complexity of the adjustments which have been required has caused a great waste in power tube capacities, since such power tubes must be operated at power levels which are considerably below the normal Class C ratings.

Practicing the invention herein to be more particularly discussed, and which is diagrammatically illustrated in Fig. 1 of the drawings, the amplitude envelope of the single-sideband wave may be completely limited off, so that only the angular component as given by portion (B) of the Equation 2, supra, remains. In the final stage of the operation, the amplitude envelope is reinserted to bring back the original wave form of the single-sideband wave. The feedback signal then is supplied to control the amplitude modulation of the outgoing wave and operates generally in a manner somewhat analogous to the usual methods of inverse feedback, except that complete amplitude modulation may be provided when necessary.

With the foregoing in mind, reference may be made first to Fig. 1 of the drawings. In this figure the modulation input signals are supplied at input terminal points 11, from which they are fed along conductors 12 to reach a suitable low level single-sideband exciter unit 13. This exciter may be of any type well known in the art, used for producing a single-sideband wave. The showing of Fig. 2, later to be discussed, exemplifies in schematic manner such an exciter unit. The output from this exciter is supplied to a limiter 15, which may substantially eliminate the amplitude envelope of the single-sideband exciter voltage. Under these circumstances, the low level power amplifier 17 may be a normal Class C amplifier, arranged to supply its output signal to a power amplifier and amplitude modulator 19. This system component may be any type of amplitude modulator system and include, therefore, a high level amplitude modulator, a low level amplitude modulator, or the like. The modulation input for this amplitude modulator is derived from an amplifier 21, of normal operating characteristics, to which a control signal is supplied from a combining amplifier 23. The output of the power amplifier and amplitude modulator 19 is supplied to any sort of load, such as that represented by the conventionally designated communication channel, illustratively shown as the antenna arrangement 25.

The input signals which are supplied to the combining amplifier 23 represent outputs from two detector elements, 27 and 29. The detector 27 is connected to be supplied by way of the conductors 30 and 31, with an input in accordance with Equation 2 which represents a portion of the output of the low level single-sideband exciter 13. Consequently, this resultant wave corresponds to the input supplied to the limiter 15. The signal input to the detector 29 is the wave appearing at the output of the power amplifier and amplitude modulator 19 as supplied to the load circuit represented by the antenna 25. These signals are derived by way of a suitable coupling coil 33, which picks up a small but yet sufficient amount of the output wave to energize the detector 29.

The combining amplifier 23 is of any well known type of mixer capable of providing an output which is proportional to the difference between the detected outputs of the detectors 27 and 29 and in its simplest form may comprise a pair of resistors connected to supply the difference voltage obtained from the combined detector outputs to the distortion-free amplifier 21. This difference signal is supplied to the amplifier 21, and thence to the amplitude modulator 19, in such polarity that the resulting wave appearing on the load circuit represented by the antenna 25 has the same amplitude modulation envelope as the wave appearing at the output of the low level single-sideband exciter unit 13. All of the components described above are of generally well known character, and thus illustration of the invention is made only in diagrammatic form, for the sake of clarity.

The limiter 15 is not an essential part of the system, but when it is present, the degree of amplitude modulation which must be applied to the final power amplifier and modulator will be equal to the degree of amplitude modulation on the original single-sideband wave. For conditions when the limiter is not present, the final amplifier may transmit some of the original envelope which was present on the single-sideband wave. This would reduce the requirements of amplitude modulation to be applied from the amplifier 21. It will be appreciated, however, that the inclusion of the limiter serves the desirable function of aiding in the adjustment, since it insures a constant input to all of the power amplifiers.

Under conditions when the limiter is present, the amplitude envelope of the single-sideband wave may be completely limited off, so that the only remaining component is that angular component represented by the portion of Equation 2 above, represented under the bracket (B). Under these circumstances, it can be seen from what has been above stated, that at the final stage the amplitude envelope is reinserted to bring back the original wave form of the single-sideband wave. Through the aid of the principle of this detection, the result is that the output provided becomes proportional to the difference between the detected envelope at the output of the transmitter and the detected envelope of the original single-sideband wave appearing at the output of the single-sideband exciter 13. This difference output so developed by means of the detector and the combining amplifier is supplied as an amplitude modulation input to the modulator 19 in a manner generally following in pattern the well known forms of inverse feedback.

For purposes of exemplifying a suitable form of single-sideband exciter reference may be made to Fig. 2. In this circuit the carrier frequency source 61, which is usually a crystal-controlled oscillator to provide a highly stabilized output, is connected to supply two amplitude modulators represented at 63 and 65. These modulators are of the well known balanced type so that they eliminate the carrier from the output. As a result, the output voltages available from these modulators consist only of sidebands of modulation supplied by the input lines 67 and 69 respectively.

The output from one of the balanced amplitude modulators, such as 63, is supplied to an upper sideband selecting filter 71. This filter has its characteristic so chosen that it passes the upper sideband frequencies but rejects the lower sideband frequencies. A lower sideband filter 73 performs a generally related function in that it rejects the upper sideband frequencies while passing the lower sideband frequencies.

Under the circumstances, the outputs appearing on lines 75 and 77 are the selected upper sideband and the selected lower sideband, respectively.

The combining circuit 79 combines the two sidebands, which may be modulated with different information by the signals on lines 67 and 69, with the carrier frequency which is supplied thereto by the connecting line 81. It is usual practice to reintroduce the carrier at a level which is considerably reduced from the corresponding level which would prevail in the ordinary double-sideband amplitude modulation. This reduced carrier component is transmitted to the receiver to be used as a pilot frequency for automatic volume control (AVC) and automatic frequency control (AFC) at the receiver by way of the output path conventionally represented at 83.

In the particular application of this invention, this transmitted carrier component serves also to keep the transmitter tubes loaded during periods of idle modulation and thereby prevents excessive dissipation of power in the plates of the transmitting tubes. The described type of single-sideband modulator uses the conventional filter type of sideband separation. However, it will be apparent that the phasing network type of single-sideband modulator may be used if desired. The general objective is to generate the single-sideband type of wave which either transmits the separate informations on the separate sidebands or a single information on only one of the sidebands.

It will be appreciated that in the system hereinabove described it is assumed that there is equal delay in signal passage through each channel. Successful operation is predicated upon the obtainment of a balance between the energy flow over the two different channels. Consequently, where there is a different signal transit time in the separate paths the time delay in these two channels must, accordingly, be equalized with the greatest degree of accuracy possible. For these reasons it is desirable to consider the steps to be taken where equalization becomes desirable.

Considering, the showing in Fig. 1, the time delay encountered by the single-sideband radio frequency wave as it travels through the limiter 15, the low level power amplifier 17 and the circuits of the power amplifier and the amplitude modulator 19 must provide, as closely as possible, the same time delay as those encountered by the wave as it is detected in the detector 27 and then fed through the combining amplifier 23 from which it is supplied to the amplifier 21 prior to being used as a control signal for the amplitude modulator 19. It thus becomes apparent that in operation the time delay encountered by the radio frequency amplified wave must equal the time delay encountered by the detected envelope component which is supplied to the final amplitude modulator.

Where a control is desirable to achieve this form of operation there are several ways to accomplish this objective. In the usual case, more time delay is found to occur in the path through the detector 27, the combining amplifier 23, the amplifier 21 and the amplitude modulator 19 than is inherently present in the path through the limiter 15 and the low level power amplifier 17 into the power amplifier and amplitude modulator 19. As a result of this condition, additional time delay must be inserted into the radio frequency path 15, 17 and 19. This result may be accomplished by the choice of selective circuits of a character which impart time delay. Per se, delay circuits are well known. For the purpose of practicing this invention, band-pass filters designed for the proper bandwidths and including the correct number of sections to impart the desired time delay may be relied upon. They may be inserted at any desired point in the radio frequency path. By way of example the delay network is represented as being included in the low level power amplifier 17. Circuitwise, they are well known and for further illustration purposes, reference may be had to a generally related application for Letters Patent of the United States, Serial No. 278,977 concurrently filed by this applicant and entitled "Sideband Transmitter."

Another method of operation which can readily be utilized is that of adding at any desired point more time delay than is necessary for operation in the radio frequency path including the limiter 15, the low level power amplifier 17 and the power amplifier and amplitude modulator 19. Then, by the addition of an adjustable time delay of generally well known character in the audio circuit between the output of the detector 27 and the input of the amplitude modulator 19, for instance, varying delays can be introduced to bring delays in the two signal paths into coincidence.

Either method suggested may be used efficiently to provide an equalization of the time delay in the two signal paths, with a result that balance will be maintained over a wide frequency range. The components, if desired, may be added in combination with any of those diagrammatically represented by the drawings, and hereinabove discussed. The time delay equalization, as a general proposition, should be considered in the operation because any effects of non-linearities and unequalized time delays tend to create a cross-modulation of one sideband over into the other sideband channel, and thereby tend to destroy the original degree of filtering provided by the sideband filters 71 and 73, represented, for instance, in Fig. 2.

Various other modifications of the invention, of course, will naturally suggest themselves from what has been hereinabove stated, provided, of course, that the significant characteristic of utilizing a difference voltage between the input and output of the modulator for the purpose of recreating the single-sideband voltage wave in the load circuit after the elimination of the amplitude thereof as a result of amplification is borne in mind.

Having now described the invention, what is claimed is:

1. In a modulated wave amplifier, means to derive a single-sideband exciter voltage from an input modulation signal, a pair of paths to receive the exciter voltage, a limiter connected in a first path to receive and limit the supplied exciter voltage, an amplitude modulator connected to receive the limited voltage, a load circuit to receive the output voltage of the amplitude modulator, detector means connected in the second path also to receive at its input the supplied exciter voltage, further detector means connected to receive as an input voltages indicative of those supplied to the load circuit by the amplitude modulator, means for differentially combining the output of the separate detector means, means for supplementarily modulating the amplitude modulator by the combined detected voltages, and amplifying means disposed between the detectors and amplitude modulator.

2. The amplifier claimed in claim 1 comprising, in addition, a delay circuit connected in the path to the amplitude modulator which includes the limiter for introducing a time delay in the exciter voltage passing therethrough to equalize the time delay over each path so that substantially the original sideband exciter voltage is recreated at higher power level in the amplitude modulator.

3. In a modulated wave amplifier, means to derive a single-sideband exciter voltage from input carrier and modulation energy, a pair of paths for the exciter voltage, an amplifier connected in one of the paths for amplifying the single-sideband voltage, said amplifier being subject to non-linear amplitude distortion, an amplitude modulator connected to receive the output from the modulator, differential detecting means connected to receive exciter voltage from the other of said paths and voltages indicative of those supplied to the load circuit by the amplitude modulator to provide the difference voltage thereof, and means for modulating the amplitude modulator by the difference voltage substantially to recreate in the load circuit the amplitude envelope of the single-sideband voltage wave.

4. In a modulated wave amplifier, means to derive a single-sideband exciter voltage from input carrier and modulation energy, a pair of paths to reecive the exciter voltage, amplifying means connected in one of the paths for receiving and amplifying the exciter voltage, amplitude modulator means connected to receive the amplified voltage, a load circuit to receive the output of the amplitude modulator, detector means connected in the other of said paths, to receive as an input the exciter voltage, further detector means connected to receive as an input voltages indicative of those supplied to the load circuit by the amplitude modulator, means connected to receive and differentially combine the outputs of the said detector means, and means for supplementarily modulating the amplitude modulator by the differentially combined detector outputs.

5. In a modulated wave amplifier, means to derive a single-sideband exciter voltage from input modulation signals, a pair of paths to receive the exciter voltage, a limiter connected in one of the paths to receive and limit the exciter voltage, an amplitude modulator also connected in said one path to receive the limited voltage, a load circuit connected to receive the output of the amplitude modulator, a detector connected in the other of said paths to receive the exciter voltage, a further detector connected to receive voltages indicative of the output voltage supplied from the amplitude modulator to the load circuit, means for differentially combining the outputs of each of the detectors to provide control voltages, means for supplementarily modulating the amplitude modulator by the control voltages, and means for equalizing the signal passage time along each path between the source of single-sideband exciter voltage and the amplitude modulator.

6. In a modulated wave amplifier, a source of carrier frequency voltage, modulator means connected to receive carrier voltage from the source and input signal voltage to develop in single-sideband fashion a resultant voltage wave of associated amplitude and phase modulation components, an amplifier connected to the modulator means to receive and amplify the resultant voltage, an amplitude modulator connected to receive the amplified resultant voltage from the amplifier, a load circuit to receive the output voltage of the amplitude modulator, detector means also connected to receive the resultant voltage and to provide, as its output, voltage in accordance with the amplitude components of modulation, further detector means connected to receive, as an input, voltage derived from the output voltage of the amplitude modulator and to provide, as its output, voltage in accordance with the amplitude components of modulation appearing in the amplitude modulator output, means for differentially combining the voltages in accordance with the amplitude components of modulation appearing as the outputs of the detectors, means for introducing into the amplitude modulator the differentially combined voltages to modulate the amplified resultant voltage, further amplifier means connected between the detector means and the amplitude modulator to amplify the amplitude modulation component voltages, and means for equalizing the time required for corresponding amplitude and phase modulation components to pass from the modulating means to the amplitude modulator whereby the resultant wave appearing in the output of the modulating means is substantially recreated in the amplitude modulator at amplified level.

7. In a modulated wave amplifier, means to derive a single-sideband exciter voltage modulated by input signal energy, an amplifier for amplifying the exciter voltage, said amplifier substantially eliminating the signal energy modulation of the single-sideband exciter voltage, an amplitude modulator connected to be supplied with the output from the amplifier, means to supply the output from the amplitude modulator to a communication channel, means for differentially detecting a portion of the single-sideband modulated exciter voltage and a portion of the amplified output voltage of the amplitude modulator, and means for introducing into the amplitude modulator the so-detected difference voltage substantially to recreate the amplitude envelope of the single-sideband voltage wave.

8. In an amplifier for single-sideband-modulated signal waves, a high frequency amplifier for amplifying the single-sideband waves, said high frequency amplifier substantially eliminating the amplitude modulation of the single-sideband waves, an amplitude modulator connected to receive the amplified single-sideband waves from the high frequency amplifier, means to supply output voltage from the amplitude modulator to a communication channel, means for differentially detecting a portion of the original single-sideband modulated waves and a portion of the amplified output voltage of the amplitude modulator, and means for introducing into the amplitude modulator the difference voltage so detected substantially to recreate the amplitude envelope of the original modulated single-sideband waves.

References Cited in the file of this patent

UNITED STATES PATENTS 2,429,649 Romander ------------- Oct. 28, 1947